United States Patent [19]
Guidash et al.

[11] Patent Number: 5,872,371
[45] Date of Patent: Feb. 16, 1999

[54] ACTIVE PIXEL SENSOR WITH PUNCH-THROUGH RESET AND CROSS-TALK SUPPRESSION

[75] Inventors: Robert M. Guidash, Rush; Paul P. Lee, Pittsford, both of N.Y.

[73] Assignee: Eastman Kodak Company, Rochester, N.Y.

[21] Appl. No.: 806,370

[22] Filed: Feb. 27, 1997

Related U.S. Application Data

[60] Provisional application No. 60/018,126, May 22, 1996.

[51] Int. Cl.$^6$ .................... H01L 27/148; H01L 29/768
[52] U.S. Cl. .................... 257/230; 257/223; 257/229; 257/239; 257/292; 257/445
[58] Field of Search .................... 257/223, 229, 257/230, 239, 292, 445; 348/308, 314

[56] References Cited

U.S. PATENT DOCUMENTS

| | | |
|---|---|---|
| 4,851,890 | 7/1989 | Miyatake . |
| 4,977,584 | 12/1990 | Kohno et al. . |
| 4,982,252 | 1/1991 | Matsunaga . |
| 4,985,776 | 1/1991 | Taniji . |
| 5,276,341 | 1/1994 | Lee ................................ 257/223 |
| 5,338,946 | 8/1994 | Guidash ........................ 257/223 |
| 5,404,039 | 4/1995 | Watanabe ...................... 257/230 |
| 5,416,345 | 5/1995 | Matsunaga .................... 257/223 |
| 5,426,317 | 6/1995 | Hirota .......................... 257/230 |

OTHER PUBLICATIONS

E. Fossum, "Active Pixel Sensors: Are CCD's Dinosaurs?", SPIE vol. 1900–08–8194–1133.

R.H. Nixon, S.E. Kemeny, C.O. Staller, and E.R. Fossum, "128×128 CMOS Photodiode–type Active Pixel Sensor with On–chip Timing, Control and Signal Chain Electronics." Proceedings of the SPIE vol. 2415, Charge–Coupled Devices and Solid–State Optical Sensors V, paper 34 (1995).

H.S. Philip Wong, "Technology and Device Scaling Considerations for CMOS Imagers." IEEE Solid State Circuits Technology Workshop on CMOS Imaging Technology, Feb. 7, 1996, San Francisco, CA.

*Primary Examiner*—Ngân V. Ngô
*Attorney, Agent, or Firm*—James D. Leimbach

[57] ABSTRACT

In an active pixel sensor having a plurality of pixels, each of the pixels having a photodetector for accumulating charge from incident light, a transfer gate for removing charge from the photodetector, a floating diffusion that acts as a sense node to an amplifier input, and a drain the improvement comprising the provision of a reset mechanism for each pixel by application of a potential adjacent the floating diffusion such that the area between the floating diffusion and the drain becomes depleted.

12 Claims, 2 Drawing Sheets

ACTIVE PIXEL SENSOR WITH PUNCH-THROUGH RESET AND CROSS-TALK SUPPRESSION

This application claims benefit of U.S. Provisional No. 60/018,126, filed May 22, 1996.

FIELD OF INVENTION

The invention relates generally to the field of solid state sensors, and in particular to sensors referred to as active pixel sensors.

BACKGROUND OF THE INVENTION

APS are solid state imagers where each pixel contains a photo-sensing means, charge to voltage conversion means, reset means, and all or part of an amplifier. They have some advantages over charge coupled device imagers (CCD), including single 5 V supply operation, x-y addressability, and high level of integration of on-chip signal processing.

APS devices are operated in a manner where each pixel is repeatedly reset and read out. The reset operation is accomplished by resetting the photodetector or charge to voltage conversion means by removing the signal charge that is residing there. This is accomplished by incorporation of a reset transistor in each pixel. Turning the reset transistor on allows signal charge to flow into the drain of the reset transistor, thus being removed from the photodetector region or charge to voltage conversion region. Since a reset transistor is included in each pixel, it occupies area that could otherwise be used for the photodetector, thus reducing the fill factor and sensitivity of the device.

A prior APS pixel is shown in FIG. 1. The pixel 10 comprises a photodetector 12, which can conceivably be either a photodiode or photogate, transfer gate 14, floating diffusion 16, reset transistor 17, with a reset gate 18 and reset drain 19, row select transistor (ROWST) 8, with a row select gate (RSG) 9 and signal transistor (SIG) 6. Pixels are arranged in an array (X-columns and Y-rows), to form an image sensor. Device operation occurs in the following manner. A given row is reset by turning on transfer gate 14 and reset gate 18. Any electrons that are in the photodetector 12 or floating diffusion 16 are removed via the reset drain 19. The transfer gate 14 and the reset gate 18 are then turned off and incident light creates electrons in the photodetector 12 for a determined time (integration time). The reset gate is then turned on, removing any electrons that may have accumulated in the floating diffusion region. The reset gate is then turned off and the reset signal level is then read out one column at a time for that row (the details of this operation are not relevant to this invention). Transfer gate 14 is then turned on and these electrons are transferred onto the floating diffusion 16 which is connected to the gate of SIG 6. This signal level is then read out a column at a time for that particular row. A CDS amplifier in each column is used to remove reset noise and noise due to pixel offset. This operation is then repeated for the remaining rows, with the integration time being of constant duration for each row, but integrated during a different time period. As discussed earlier, the incorporation of a reset transistor in each pixel reduces the fill factor and sensitivity of the device. Additionally, the row by row reset integrate and read operation can produce image artifacts.

There are two basic types of charge to voltage conversion means, the floating diffusion and the floating gate. The floating diffusion method provides very good sensitivity, (i.e. small capacitance), but results in an incomplete reset which leads to reset noise. The FG method provides a complete reset and consequently no reset noise, but has poor sensitivity. The floating diffusion approach has been used predominantly in APS and charge coupled devices, (CCD) to obtain good sensitivity. The reset noise is dealt with by performing correlated double sampling (CDS).

In order to perform CDS and eliminate the reset noise the reset operation must occur prior to the read operation. Because of this need to have a reset signal level prior to a read signal level, APS devices have been operated in a manner where each line or row of the imager is reset, integrated and read out at a different time interval than each of the remaining lines or rows. Hence if one were reading out the entire imager, each line would have captured the scene at a different point in time. Since illumination conditions can and do vary temporally, and since objects in the scene may also be moving, this method of read out can produce line artifacts in the resulting representation of the image. This limits the usefulness of APS devices in applications where high quality motion or still images are required. This problem can be overcome by reading the signal level then the reset level, but as stated above this would not eliminate the reset noise.

In order to solve the problems of APS devices described above, it is desirable to provide a reset means that does not reduce the fill factor of the pixel. It is also desirable to provide a reset means that is complete so that the APS device could be operated in a manner where it is read then reset without introduction of reset noise.

SUMMARY OF THE INVENTION

The present invention addresses the foregoing problems by providing a new pixel architecture and reset method that eliminates the need for a reset transistor per pixel, and provides a complete reset thus eliminating reset noise and the need to do correlated double sampling (CDS). In an active pixel sensor having a plurality of pixels, each of the pixels having a photodetector for accumulating charge from incident light, a transfer gate for removing charge from the photodetector, a floating diffusion that acts as a sense node to an amplifier input, and a drain the improvement comprising providing reset of each pixel by means of application of a potential adjacent the floating diffusion such that the area between the floating diffusion and the drain becomes depleted. In a similar manner the photodetector can be reset in the same manner by placing the reset drain next to the photodetector.

The present invention provides a means for reducing the components required for the reset operation, and further provides a complete reset so that the device can be operated in a manner where the entire imager is integrated at the same time (rather than a row at a time), without suffering from reset noise. This new architecture will be referred to as an APS with punch-through reset. The floating diffusion is reset by completely depleting the region between the reset drain and floating diffusion, so that one has "punch-through" from the reset drain to the floating diffusion. By doing so, all of the charge stored on the floating diffusion will be taken out through the reset drain. Two physical embodiments of the new pixel architectures are shown in FIGS. 2A and 2B (only the features relevant to this invention are shown). Other specific physical embodiments are realizable. These two are chosen for illustration.

In the first physical embodiment (shown in FIG. 2B), the pixel comprises a photodetector, transfer gate, floating diffusion, SIG, RSG, ROWST and reset drain. It does not contain a separate reset gate or reset transistor. In this architecture, the reset operation is accomplished by applying the supply voltage, VDD, or some other appropriate voltage to the desired reset drains (OV, or other appropriate voltage, to the remaining reset drains), so that the p-type region in-between the reset drain and the floating diffusion is depleted. By depleting the p-type region, all of the electrons stored on the floating diffusion will be spilled into the reset drain, providing a complete reset of the floating diffusion. Pixel offset cancellation can still be done by a read then reset clamp and sample. The area that was previously used for RES and RG can now be used for the photodetector, thus improving the fill factor and sensitivity of the pixel.

The buried reset drains are connected together within a row by a buried layer. The buried layer and buried reset drain can be constructed by several means known within the art of integrated circuit fabrication (e.g. high speed BICMOS processes).

The pixel in FIG. 2B is similar to that of FIG. 2A except the reset drain 29 is formed by a deep n-diffusion from the surface, rather than a buried reset drain 27. By application of an appropriate positive voltage (e.g. VDD) the p-type region is depleted and the floating diffusion is completely reset.

These and other aspects, objects, features and advantages of the present invention will be more clearly understood and appreciated from a review of the following detailed description of the preferred embodiments and appended claims, and by reference to the accompanying drawings.

Advantageous Effect Of The Invention

Fill factor is improved by the reset means requiring no pixel surface area. A complete reset is achieved with a high sensitivity floating diffusion structure, so reset noise is eliminated. Pixel cross-talk is suppressed.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

This invention provides a means for reducing the components and area required for the reset operation of APS devices, providing higher fill factor and sensitivity over prior art devices. It also provides a complete reset so that the device can be operated in a manner where the entire imager is integrated at the same time (rather than a row at a time), without suffering from reset noise.

Figure 1:
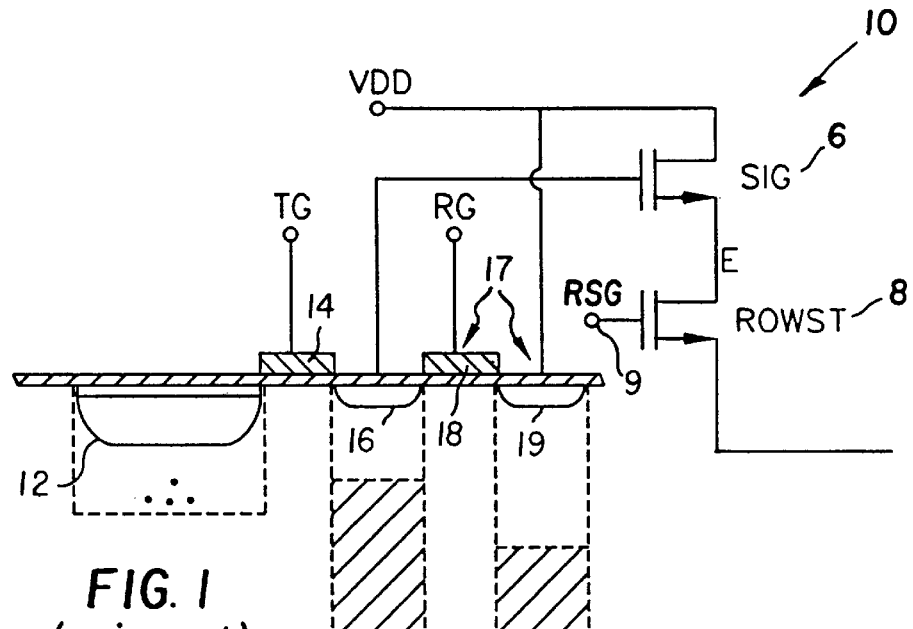
FIG. 1 is a prior art pixel.
Figure 2A:
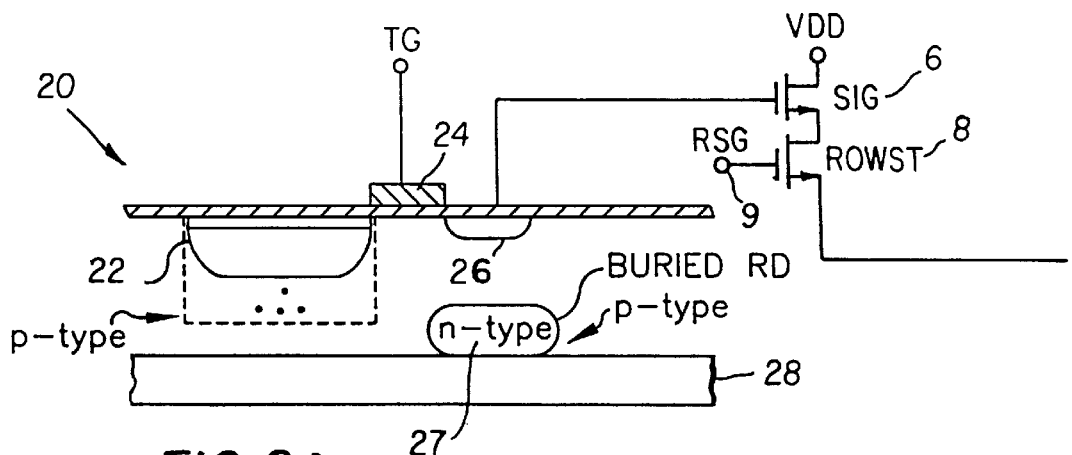
FIG. 2A is a first embodiment of a pixel of the present invention.
Figure 2B:
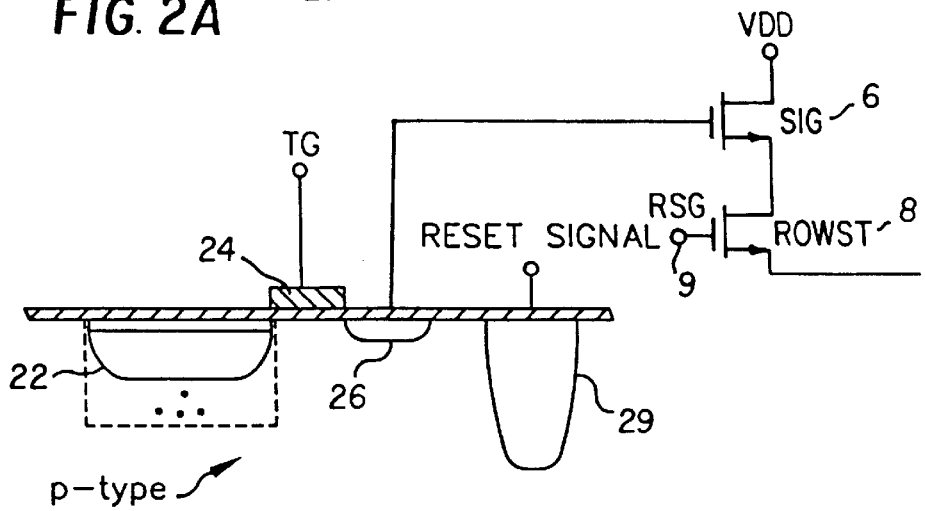
FIG. 2B is a second embodiment of a pixel of the present invention.

This new architecture will be referred to as an APS with punch-through reset. Punch through reset can be accomplished either by resetting the photodetector portion, or by resetting the floating diffusion. In the case of the photodetector, a drain is positioned adjacent the photodetector. The floating diffusion is reset by completely depleting the region between the reset drain and floating diffusion, so that one has "punch-through" from the reset drain to the floating diffusion. By doing so, all of the charge stored on the floating diffusion will be taken out through the reset drain. Two physical embodiments of the new pixel architectures are shown in FIGS. 2A and 2B. Other specific physical embodiments are realizable. These two are chosen for illustration.

In the first preferred embodiment (shown in FIG. 2A), the pixel 20 comprises a Photodetector 22, Transfer Gate 24, Floating diffusion 26, SIG 6, RSG 8, ROWST 9 and reset drain 27. It does not contain a separate reset gate or reset transistor. In this architecture, the reset operation is accomplished by applying the supply voltage VDD, or some other appropriate voltage to the desired reset drain (OV, or appropriate voltage, to the remaining reset drains), so that the p-type region in between the reset drain and floating diffusion is depleted. By depleting the p-type region, all of the electrons stored on the floating diffusion will be spilled into the reset drain, providing a complete reset of the floating diffusion. Pixel offset cancellation can still be done by differencing the read and reset signals. The reset drain is now buried underneath the floating diffusion, and the reset drains in that row are connected together by an n-type buried layer, so that none of the pixel surface area is used for the reset operation, thus improving the fill factor and sensitivity of the pixel.

The buried reset drains are connected together within a row by a buried layer The buried layer and buried reset drain can be constructed by several means. In one case both the buried layer and buried drain can be constructed by 2 separate n-type implants prior to epitaxial deposition. The implant doses would be designed to provide the appropriate up diffusion during the rest of the thermal processing of the device. The buried layer would be patterned underneath at least a portion of the photodetector with the appropriate implant dose and/or species to provide cross-talk suppression but still have adequate red response. The buried reset drain implant would be patterned under at least a portion of the floating diffusion with the appropriate implant dose and/or species to provide a p-type region left between the floating diffusion and reset drain that could be completely depleted with a desirable reset potential.

This could also be accomplished by forming the buried layer with an n-type implant prior to epitaxial deposition, and forming the buried reset drain with a high energy implant after epitaxial deposition.

The pixel in FIG. 2B is similar to that of FIG. 2A, comprising like elements except that reset drain 29 is formed by a deep n-diffusion from the surface, rather than a buried reset drain 27 with an n-type buried layer 28 as used in FIG. 2A. Any application of an appropriate positive voltage, (e.g. VDD), results in the p-type region in between the reset drain and the floating diffusion being depleted, and resulting in the floating diffusion being completely reset. This approach has the disadvantage of requiring pixel surface area compared to the buried reset drain approach, but takes less surface area than the separate transistor used in prior art.

In this case a buried layer is not required, and the reset drain region could be formed by a separate implant that is done prior to the N-well drive or field oxidation (i.e. the largest thermal process step). However, a buried layer could be utilized to connect to the reset drain region so that a separate reset buss in an interconnect layer is not required.

The buried layer would be formed and patterned as described above.

Figure 2C:
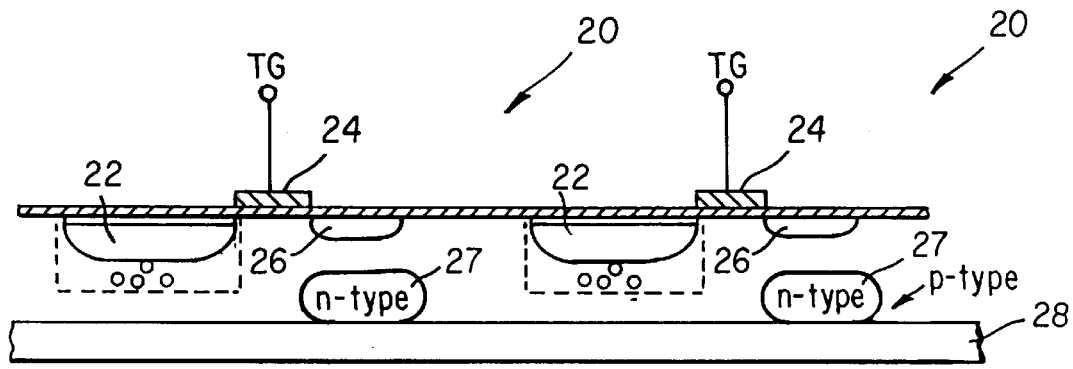
FIG. 2C shows a row of pixels from FIG. 2A where the reset drains are connected together by a patterned buried layer.
Figure 2D:
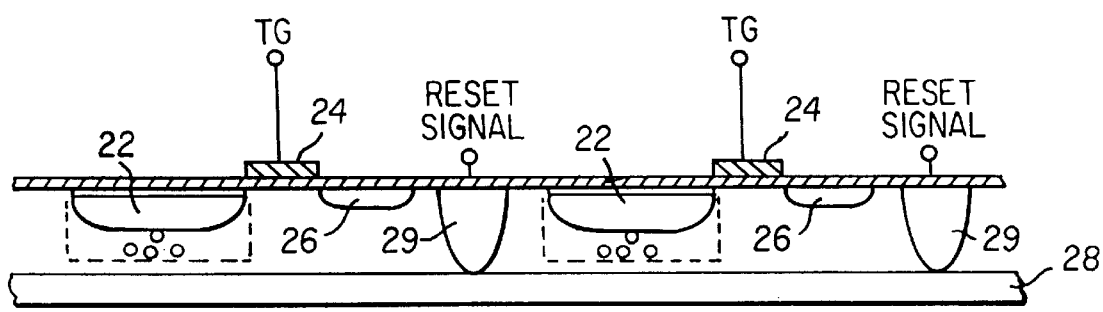
FIG. 2D shows a row of pixels from FIG. 2b where the reset drains are connected together by a patterned buried layer.

FIG. 2C shows a row of the pixels as illustrated in FIG. 2A wherein the reset drains 27 are connected together by a patterned buried layer 28. FIG. 2D shows a row of pixels as illustrated in FIG. 2B wherein the reset drains 29 are connected together by a patterned buried layer 28. In both FIG. 2C and FIG. 2D the SIG 6, RSG 9 and ROWST 8 have been omitted for simplicity of drawing.

The invention has been described with reference to a preferred embodiment. However, it will be appreciated that variations and modifications can be effected by a person of ordinary skill in the art without departing from the scope of the invention.

Parts List 6. signal transistor
8. row select transistor
9. a row select gate
1. pixel
12. photodetector
14. transfer gate
1. floating diffusion
17. reset transistor
18. reset gate
19. reset drain
20. pixel
22. photodetector
24. transfer gate
26. floating diffusion
27. buried reset drain
28. buried layer
29. reset drain

We claim:

1. In an active pixel image sensor which is formed upon a semiconductor material having at least one pixel formed on a surface of the semiconductor material, such that the pixel having a photodetector for accumulating charge from incident light, a transfer gate for removing charge from the photodetector, a floating diffusion that acts as a sense node to an amplifier input, and a reset drain the improvement comprising: a provision of a reset mechanism for the pixel by application of a potential to a drain adjacent to the floating diffusion such that at least a portion of the area between the floating diffusion and the drain becomes depleted.

2. The active pixel sensor of claim 1 wherein the reset mechanism further comprises the drain being buried within the substrate and the reset mechanism operating by applying the potential to the drain.

3. The active pixel sensor of claim 1 wherein the reset mechanism further comprises the drain within he surface of the substrate and the reset mechanism perating by applying the potential to the drain.

4. The active pixel sensor of claim 1 wherein a predetermined set of reset drains are connected together by a n-type buried layer.

5. The active pixel sensor of claim 4 wherein the buried layer is patterned underneath at least a portion of the photodetector.

6. An active pixel sensor comprising:

at least one pixel formed on a surface of a semiconductor substrate, such that the pixel has a photodetector for accumulating charge created from incident light that is coupled to an amplifier input for an amplifier that is at least partially formed within the pixel;

a set of reset drains connected together by a n-type buried layer and coupled to the photodetector such that application of a predetermined potential to one of the drains results in depleting at least part of the region between the drain and the photodetector.

7. The active pixel sensor of claim 6 wherein the buried layer is patterned underneath at least a portion of the photodetector.

8. In an active pixel image sensor which is formed upon a semiconductor material having at least one pixel formed on a surface of the semiconductor material, such that the pixel has a photodetector for accumulating charge created from incident light, the photodetector acting as a sense node being connected to an amplifier input for an amplifier that is at least partially formed within the pixel, and a reset drain the improvement comprising: a provision of a reset mechanism for the pixel by application of a potential to a drain adjacent to the photodetector such that at least a portion of the area between the photodetector and the drain becomes depleted.

9. The active pixel sensor of claim 8 wherein the reset mechanism further comprises the drain being buried within the substrate and the reset mechanism operating by applying the potential to the drain.

10. The active pixel sensor of claim 8 wherein the reset mechanism further comprises the drain within the surface of the substrate and the reset mechanism operating by applying the potential to the drain.

11. The active pixel sensor of claim 8 wherein a predetermined set of reset drains are connected together by a n-type buried layer.

12. The active pixel sensor of claim 8 wherein the buried layer is patterned underneath at least a portion of the photodetector.

* * * * *

UNITED STATES PATENT AND TRADEMARK OFFICE
CERTIFICATE OF CORRECTION

PATENT NO. : 5,872,371
DATED : February 16, 1999
INVENTOR(S) : Robert M. Guidash, et al It is certified that error appears in the above-identified patent and that said Letters Patent is hereby corrected as shown below:

Col. 5, line 22         -- "1" should be --16.--

Signed and Sealed this

Sixth Day of July, 1999

Attest:

Q. TODD DICKINSON

*Attesting Officer*          *Acting Commissioner of Patents and Trademarks*